United States Patent
Chu et al.

(10) Patent No.: US 8,680,405 B2
(45) Date of Patent: Mar. 25, 2014

(54) CIRCUIT BOARDS

(75) Inventors: Wei-Lun Chu, Hsinchu (TW); Chih-Chiang Lee, Hsinchu (TW)

(73) Assignee: Accton Technology Corporation, Hsinchu (TW)

( * ) Notice: Subject to any disclaimer, the term of this patent is extended or adjusted under 35 U.S.C. 154(b) by 250 days.

(21) Appl. No.: 13/218,522

(22) Filed: Aug. 26, 2011

(65) Prior Publication Data

US 2012/0048608 A1  Mar. 1, 2012

(30) Foreign Application Priority Data

Aug. 31, 2010 (TW) ................ 99129209 A

(51) Int. Cl.
*H05K 1/11* (2006.01)
*H05K 1/16* (2006.01)

(52) U.S. Cl.
USPC ........... 174/262; 174/260; 174/263; 174/264; 174/265; 174/266

(58) Field of Classification Search
USPC ............ 174/260–267; 361/792–795
See application file for complete search history.

(56) References Cited

U.S. PATENT DOCUMENTS

| | | | |
|---|---|---|---|
| 2004/0040744 A1* | 3/2004 | Wyrzykowska et al. | 174/262 |
| 2006/0243481 A1* | 11/2006 | Bachar et al. | 174/262 |
| 2008/0087461 A1* | 4/2008 | Farkas et al. | 174/266 |
| 2008/0314625 A1* | 12/2008 | Hamada et al. | 174/255 |
| 2009/0049414 A1* | 2/2009 | Mutnury et al. | 716/2 |
| 2009/0159326 A1* | 6/2009 | Mellitz | 174/266 |

* cited by examiner

*Primary Examiner* — Timothy Thompson
*Assistant Examiner* — Sherman Ng
(74) *Attorney, Agent, or Firm* — WPAT, PC; Justin King

(57) ABSTRACT

The present invention relates to a circuit board. The circuit board includes: a first path is routed on a first layer of the circuit board for transferring a first signal; a second path is routed on a second layer of the circuit board for transferring a second signal; a third path is routed on third layer of the circuit board; a first via is coupled to the first and third paths, and the first via is removed when the second signal is transferred by the second path; a second via is coupled to the second and third paths, and the second via is removed when the first signal is transferred by the first path.

6 Claims, 4 Drawing Sheets

CIRCUIT BOARDS

BACKGROUND OF THE INVENTION

1. Field of the Invention

The present invention relates to a circuit board, more particularly, to a circuit board commonly operating different transmission interface.

2. Description of the Prior Arts

In data communication network, the network device (such as Ethernet switch) generally used for accessing signal with different signal transmission speed since having different interfaces which respectively comply with different transmission standard, such as Serdes Framer Interface (SFI) or Gigabit Media Independent Interface (SGMII), wherein Serdes Framer Interface access signal with 10 Gigabits per second, as shown in FIG. 1A, and Serial Gigabit Media Independent Interface (SGM II) access signal with 1 Gigabits per second, as shown in FIG. 1B.

At present, a circuit board needs to be designed with appropriately layout thereon in order to be adapted with different interface components. However, increasing manufacturing cost and excess material will occur since each circuit board can't be used for different interface components.

For the reason that the conventional circuit board cannot effectively solve the drawbacks mentioned above, a need has thus arisen to propose a novel circuit board commonly be operated in different transport interfaces for providing the interoperability between the different interface components.

SUMMARY OF THE INVENTION

In view of the disadvantages of prior art, the primary object of the present invention is to solve the disadvantage of the circuit board which can't be applied to different interface components that transmit signal according to different transport protocols. Therefore, the circuit board of present invention can be applied for adapting different interface components and can advances the interoperability between the different interface components.

According to another object of the present invention is to solve the disadvantage of the conventional network devices providing different interface that can not commonly apply the same circuit board to adapt another interface components. Therefore, the present invention can decrease times in designing of layout on circuit board and decrease manufacturing cost.

For achieving the objects mentioned above, the present invention provides a circuit board, comprises:

a first path, routed on a first layer of the circuit board for transferring a first signal;

a second path, routed on a second layer of the circuit board for transferring a second signal;

a third path, routed on a third layer of the circuit board;

a first via, coupled to the first and third paths, wherein the first via is removed when the second signal is transferred by the second path; and a second via, coupled to the second and third paths, wherein the second via is removed when the first signal is transferred by the first path.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

Figure 1A:
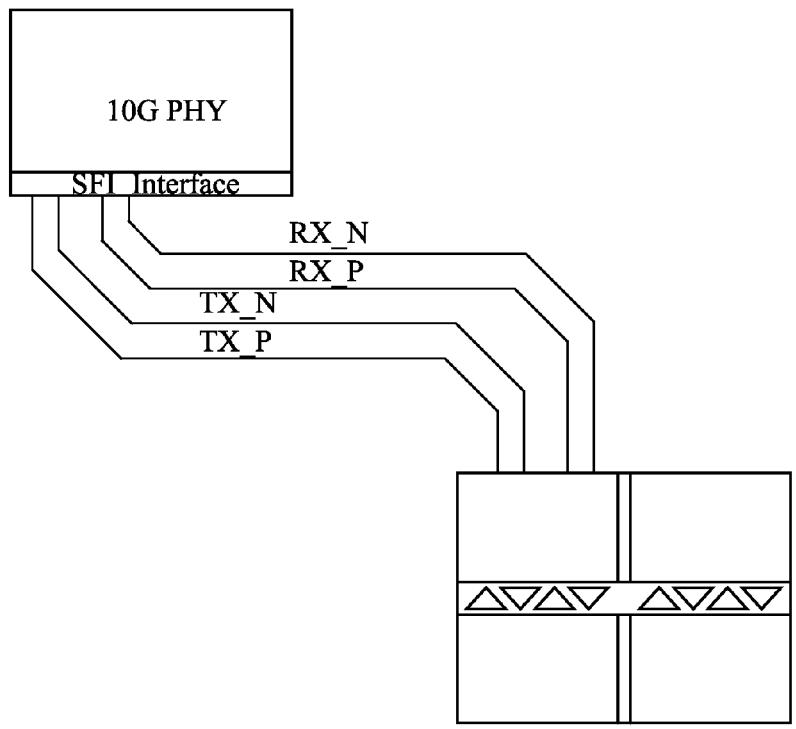
FIGS. 1A and 1B illustrates a conventional circuit design.
Figure 1B:
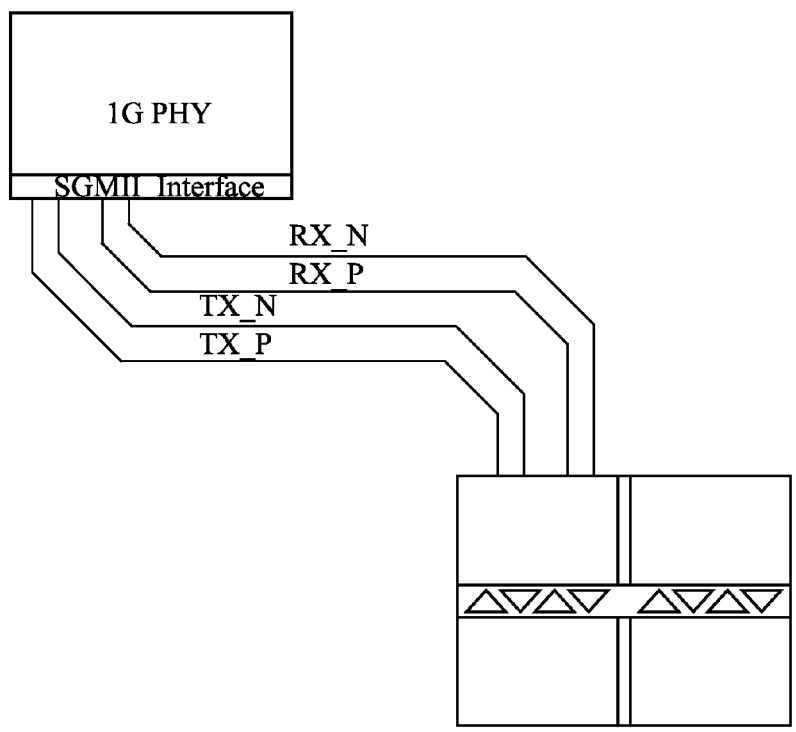
Figure 2:
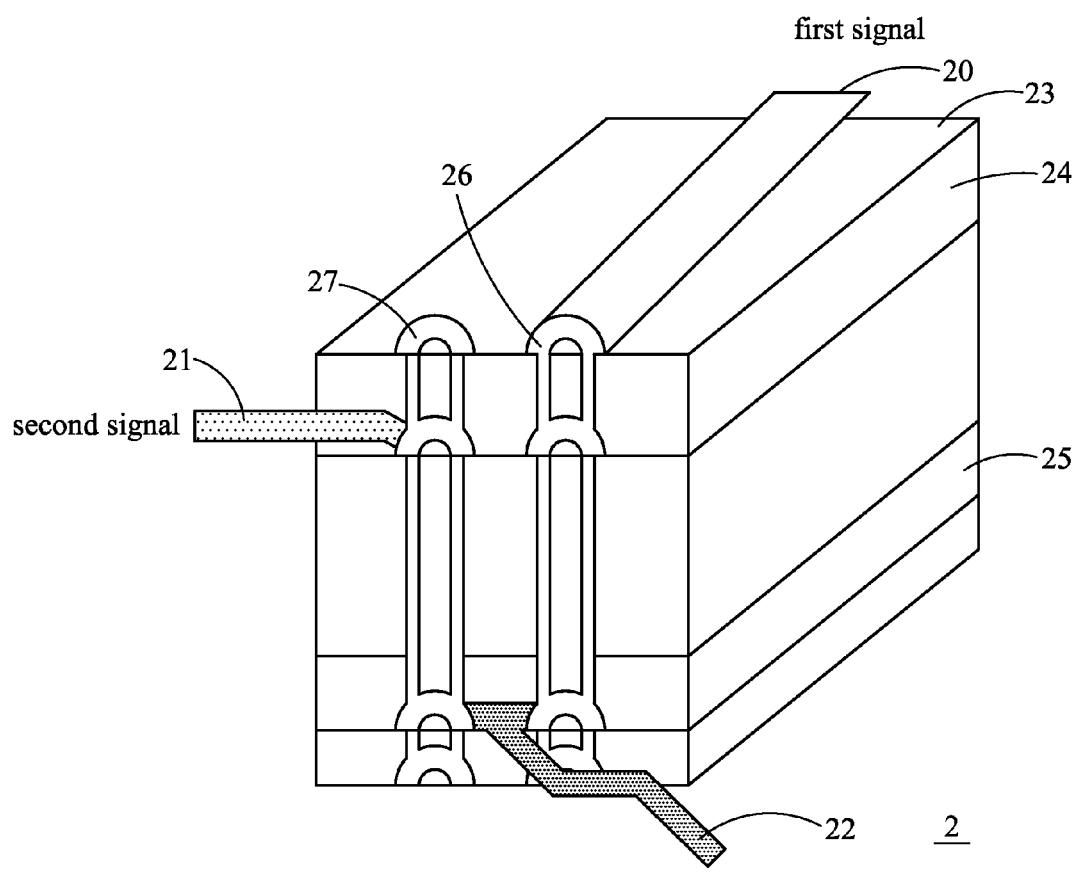
FIG. 2 illustrates a solid cross-section diagram showing a circuit board 2 according to one embodiments of the present invention.

FIG. 2 illustrates a solid cross-section diagram showing a circuit board 2 according to one embodiments of the present invention. The circuit board 2 includes: a first path 20 is routed on a first layer 23 of the circuit board 2 for transferring a first signal; a second path 21 is routed on a second layer 24 of the circuit board 2 for transferring a second signal; a third path 22 is routed on a third layer 25 of the circuit board 2; a first via 26 is coupled to the first and third paths 20, 22, and the first via 26 is removed when the second signal is transferred by the second path 21; a second via 27 is coupled to the second and third paths 21, 22, and the second via 27 is removed when the first signal is transferred by the first path 20. Moreover, the first path is used for coupling to a first interface component (not shown in), and receiving and transferring the first signal from the first interface component according to a first transport protocol, and wherein the first transport protocol is SFI. The second path is used for coupling to a second interface component (not shown in), and receiving and transferring the second signal from the second interface component according to a second transport protocol (not shown in), and wherein the second transport protocol is SGMII. Additionally, the third path 22 is further coupled to a connector (not shown in), which is used for outputting the first signal when the first path is used for transferring the first signal, or is used for outputting the second signal when the second path is used for transferring the second signal. The first path, second path or third path may be made from the conductively material. In present embodiment of invention, the conductively material is a metal conductively material such as copper.

Figure 3A:
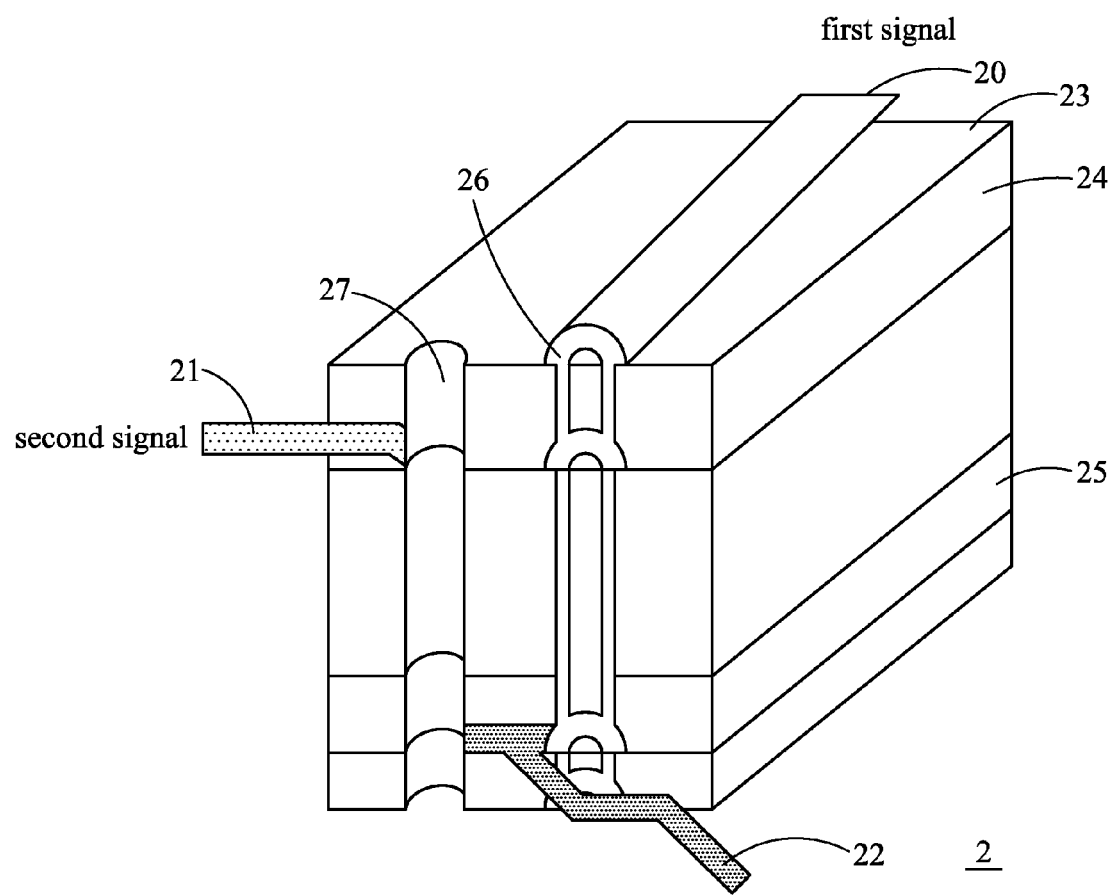
FIG. 3A illustrates a solid cross-section diagram showing one embodiment of using the first interface component on the circuit board of the present invention.

FIG. 3A illustrates a solid cross-section diagram showing one embodiment of using the first interface component on the circuit board of the present invention. The second via 27 on the circuit board 2 is removed when the circuit board of the embodiment of present invention is decided to apply the first interface component, and the second via 27 is removed for breaking connection between the second path 21 and the third path 22. In the embodiment of present invention, the second via 27 is removed by drilling so as to generate the open circuit effect, but it is not limited herein. Therefore, the first interface component (not shown in) transfers the first signal through the first path 20. In the embodiment of present invention, the first interface component is an interface component which transmits the signal according to the first transport protocol, for example, SFI chip or IC with SFI pin. Subsequently, the first signal transferred to the third path 22 through the first via 26 is outputted by the connector connected to the third path 22.

Figure 3B:
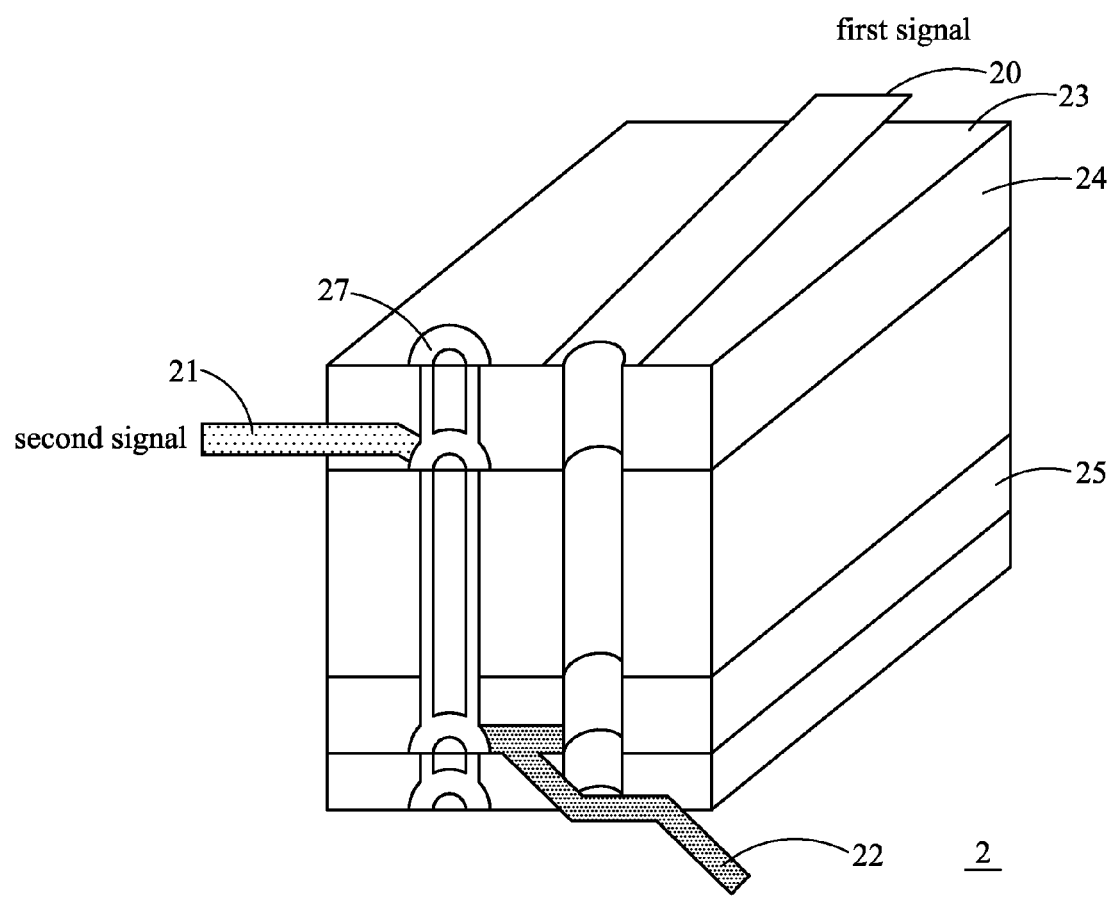
FIG. 3B illustrates a solid cross-section diagram showing one embodiment of using the second interface component on the circuit board of the present invention.

FIG. 3B illustrates a solid cross-section diagram showing one embodiment of using the second interface component on the circuit board of embodiment of the present invention. The first via 26 on the circuit board 2 is removed when the circuit board 2 of embodiment of the present invention is decided to apply the second interface component, and the first via 26 is removed for breaking connection between the first path 20 and the third path 22. In the embodiment of present invention, the first via 26 is removed by drilling so as to generate the open circuit effect, but it is not limited herein. Therefore, the second interface component (not shown in) transfers the second signal through the second path 21. In the embodiment of present invention, the second interface component is an interface component which transmits signal according to the second transport protocol, for example, SGMII chip or IC with SGM II pin. Subsequently, the second signal transferred to the third path 22 through the second via 27 is outputted by the connector connected to the third path 22.

According to another embodiment for a network device of the present invention, the network device includes the first interface component (not shown in) and the circuit board, which includes the first path 20 routed on the first layer 23 of the circuit board 2 for transferring the first signal, the third path 22 routed on a third layer 25 of the circuit board 2, and the first via 26 coupled to the first and third paths 20, 22. Thereby, the first signal is transferred from the first interface component to the third path 22 through the first path 20 and the first via 26, and the first signal is transferred out by the connector (not shown in) connected to the third path 22. In the embodiment, the first interface component indicates transferring the signal by the interface component according to the first transport protocol, for example, SFI chip or IC with SFI pin.

According to the other embodiment of the network device of the present invention, the network device includes the second interface component (not shown in) and the circuit board, which includes the second path 21 routed on the second layer 24 of the circuit board 2 for transferring the second signal, the third path 22 routed on a third layer 25 of the circuit board 2, and the second via 27 is coupled to the second and third paths 21, 22. Thereby, the second signal is transferred from the second interface component to the third path 22 through the second path 21 and the second via 27, and the second signal is outputted by the connector (not shown in) connected to the third path 22.

According to the embodiments mentioned above, one skilled person in the art should understand the circuit board of the present invention is also modified as a circuit board having multi-paths and multi-vias for corresponding to interface components with different transport protocols. Thereby, circuit board manufacturer may simplify the mold design of the circuit board and lower the cost for manufacturing circuit mold, etc. Moreover, manufacturer must respectively design circuit board having different transport protocol for corresponding different circuit boards with different transport protocols, resulting in increasing cost for manufacturing circuit board. Hereby, the present invention not only decreases the amount of generating appropriative circuit board, but also lowers the development cost for designing circuit board and the manufacturing cost. Additionally, by removing the via, it not only increases application efficiency but also decreases interference in signal transmission to maintain the signal integrity because of the stub trace.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

We claim:
1. A circuit board, comprising:
a first path, routed on a first layer of the circuit board for transferring a first signal;
a second path, routed on a second layer of the circuit board for transferring a second signal;
a third path, routed on a third layer of the circuit board;
a first via, coupled to the first and third paths, wherein the first via is removed when the second path is utilized to transmit the second signal; and
a second via, coupled to the second and third paths, wherein the second via is removed when the first path is utilized to transmit the first signal;
wherein the first path is used for coupling to a first interface component and the second path is used for coupling to a second interface component,
wherein the first interface component transfers the first signal according to a first transport protocol and the second interface component transfers the second signal according to a second transport protocol, and
wherein the first transport protocol is Serdes Framer Interface(SFI) and the second transport protocol is Serial Gigabit Media Independent Interface(SGM II).

2. The circuit board as recited in claim 1, wherein the circuit board is applied in a network device, which comprises the first or second interface component.

3. The circuit board as recited in claim 2, wherein the network device is a switch.

4. A circuit board, comprising:
a first path, routed on a first layer of the circuit board for transferring a first signal, wherein the first path is used for coupling to a first interface component;
a second path, routed on a second layer of the circuit board for transferring a second signal, where the second path is used for coupling to a second interface component;
a third path, routed on a third layer of the circuit board;
a first via, coupled to the first and third paths, wherein the first via is removed when the second path is utilized to transmit the second signal; and
a second via, coupled to the second and third paths, wherein the second via is removed when the first path is utilized to transmit the first signal, wherein said second via is completely removed when said first path is utilized to transmit said first signal, and said first via is completely removed when said second path is utilized to transmit said second signal;

wherein the first interface component transfers the first signal according to Serdes Framer Interface(SFI) and the second interface component transfers the second signal according to Serial Gigabit Media Independent Interface(SGM II).

5. The circuit board as recited in claim 4, wherein the circuit board is applied in a network device, which comprises the first or second interface component.

6. The circuit board as recited in claim 5, wherein the network device is a switch.

* * * * *